(12) United States Patent
Kim

(10) Patent No.: US 7,501,848 B2
(45) Date of Patent: Mar. 10, 2009

(54) METHOD AND APPARATUS FOR MEASURING LEAKAGE CURRENT

(75) Inventor: Jong Min Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/896,045

(22) Filed: Aug. 29, 2007

(65) Prior Publication Data

US 2008/0054932 A1    Mar. 6, 2008

(30) Foreign Application Priority Data

Aug. 30, 2006    (KR)    ............... 10-2006-0083179

(51) Int. Cl.
*G01R 31/26*    (2006.01)
(52) U.S. Cl. ................. 324/765; 324/767; 324/769
(58) Field of Classification Search ............ 324/767, 324/769, 765
See application file for complete search history.

(56) References Cited

U.S. PATENT DOCUMENTS

| | | | | |
|---|---|---|---|---|
| 4,409,501 A | * | 10/1983 | Eickerman et al. | ........... 327/143 |
| 4,785,207 A | * | 11/1988 | Eng | ........................... 327/541 |
| 5,153,453 A | * | 10/1992 | Walters | ...................... 327/502 |

* cited by examiner

*Primary Examiner*—Ha Tran T Nguyen
*Assistant Examiner*—Karen M Kusumakar
(74) *Attorney, Agent, or Firm*—Finnegan, Henderson, Farabow, Garrett & Dunner, L.L.P.

(57) ABSTRACT

A method and apparatus for measuring a leakage current of a semiconductor device having a first end and a second end are disclosed. The apparatus for measuring a leakage current includes a capacitor having one end coupled with the first end of the semiconductor device; and a MOSFET transistor having a drain node, a gate node formed to be coupled with one end of the semiconductor and source and bulk nodes formed to be coupled with the second end of the semiconductor device and to receive power.

11 Claims, 2 Drawing Sheets

METHOD AND APPARATUS FOR MEASURING LEAKAGE CURRENT

CROSS REFERENCES

The application claims the priority and benefits of Korean Patent Application No. 10-2006-0083179, filed on Aug. 30, 2006, the entire contents of which are incorporated by reference.

TECHNICAL FIELD

The present invention relates to a method and apparatus for measuring a leakage current in semiconductor devices.

BACKGROUND

In the prior art method for measuring a P-N junction leakage current, the size of a test structure is determined based on the electrical current sensitivity level of the measurement equipment. In general, in order to precisely measure a leakage current with existing measurement equipment, a P-N junction should be made to have a leakage current of above $10^{-12}$ A.

Thus, considering that a general P-N junction leakage current is $10^{-18}$ A/$\mu$m$^2$~$10^{-15}$ A/$\mu$m$^2$, a large test structure is required.

This means that in order to measure a leakage current with respect to a small particular device, thousands to tens of thousands of such devices should be formed in the form of an array.

As a result, the prior art leakage current measurement method has a problem that a large test structure is required to accurately measure a leakage current. Further, the leakage current of an actual device in use is measured in the form of an array, rather than being directly measured, and the measurement is estimated by an average value of the array.

SUMMARY OF THE INVENTION

It is, therefore, one object of the present invention to provide a method and apparatus for directly measuring a leakage current of a semiconductor device.

Another object of the present invention is to provide a method and an apparatus for measuring a leakage current capable of minimizing the size of a test structure.

In accordance with one aspect of the present invention, there is provided an apparatus for measuring a leakage current of a semiconductor device having a first end and a second end. The apparatus may include a capacitor having one end coupled with one end of a semiconductor device; and a MOSFET transistor having a drain node, a gate node formed to be coupled with the first end of the semiconductor, and source and bulk nodes formed to be coupled with the second end of the semiconductor device and to receive power.

In accordance with another aspect of the present invention, there is provided a method used in apparatus for measuring a leakage current of a semiconductor device having a first end and a second end. The apparatus may include a capacitor having one end connected with the first end of the semiconductor device and a test MOSFET transistor having a drain node, a gate node formed to be coupled with the first end of the semiconductor device, and source and bulk nodes formed to be coupled with the second end of the semiconductor device and to receive power. The method may include applying current to the source node; measuring voltage of the source node versus time; and measuring a leakage current of the semiconductor device by applying the voltage of the source node versus time to an equation of $$Id = Cr\frac{dVs(t)}{dt} + Cdgo\frac{dVs(t)}{dt},$$

wherein Id is the leakage current of the measurement target, Cr is the capacitance of the capacitor, Vs(t) is the voltage of the source node versus time, and Cdgo is an overlap capacitance of the drain and the gate.

BRIEF DESCRIPTION OF THE DRAWINGS

The above and other objects and features of the present invention will become apparent from the following description of preferred embodiments provided in conjunction with the accompanying drawings, in which.

DETAILED DESCRIPTION

Hereinafter, exemplary embodiments of the present invention will be described in detail with reference to the accompanying drawings.

Figure 1:
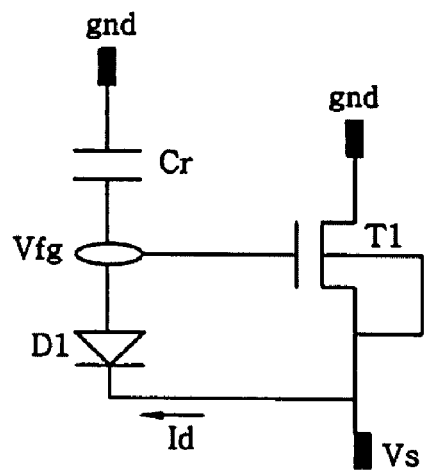
FIG. 1 shows an exemplary circuit of an apparatus for measuring a leakage current consistent with the present invention.

FIG. 1 shows an exemplary circuit of an apparatus for measuring a leakage current consistent with the present invention.

With reference to FIG. 1, the circuit may include a diode D1, a metal-oxide-semiconductor field-effect transistor (MOSFET) transistor T1, and a capacitor Cr. The circuit may also include electrical terminals or connection points for ground and various voltages. The diode D1 is a semiconductor device including a P-N junction region, and the P-N junction region may incur a leakage current Id to be measured based on the circuit.

The MOSFET transistor T1 and the capacitor Cr are provided to measure the leakage current Id of the diode D1 within the circuit. The capacitor Cr may also be referred to as a reference capacitor.

Here, the leakage current Id refers to a current flowing through the P-N junction region when a reverse voltage is formed at the P-N junction region of the diode D1.

The diode D1 may have two ends for connecting the diode D1 with other devices in the circuit. For example, one end of the diode D1 is commonly coupled with the reference capacitor Cr and a floating gate node of the MOSFET transistor T1, and the other end is coupled with a source node of the MOSFET transistor T1.

The MOSFET transistor T1 is operated as a source-follower MOSFET transistor, and in order to remove a voltage change between the floating gate node and a bulk well, the source node is commonly connected with a bulk node. A drain node of the MOSFET transistor T1 is coupled to ground. Further, one node of the reference capacitor Cr is also coupled to ground.

As for voltage Vfg applied to the floating gate node, because there may occur a natural leakage current even when the diode D1 is in an inverse voltage state, with no voltage applied, the floating gate voltage Vfg and the source voltage Vs may both be in a state of 0V.

In this state, when a current Is (not shown) is applied to the source node so as to be operated in a saturation region, a certain voltage is formed between the floating gate node and the source node according to the source-follower characteristics. At this time, an initial source voltage Vs is formed at a source terminal.

A voltage Vd (not shown) at the diode D1 relies on voltage applied between the floating gate node and the source node. This means that the floating gate voltage Vfg and the source voltage Vs are also uniformly applied as inverse voltages to the diode D1.

Figure 2:
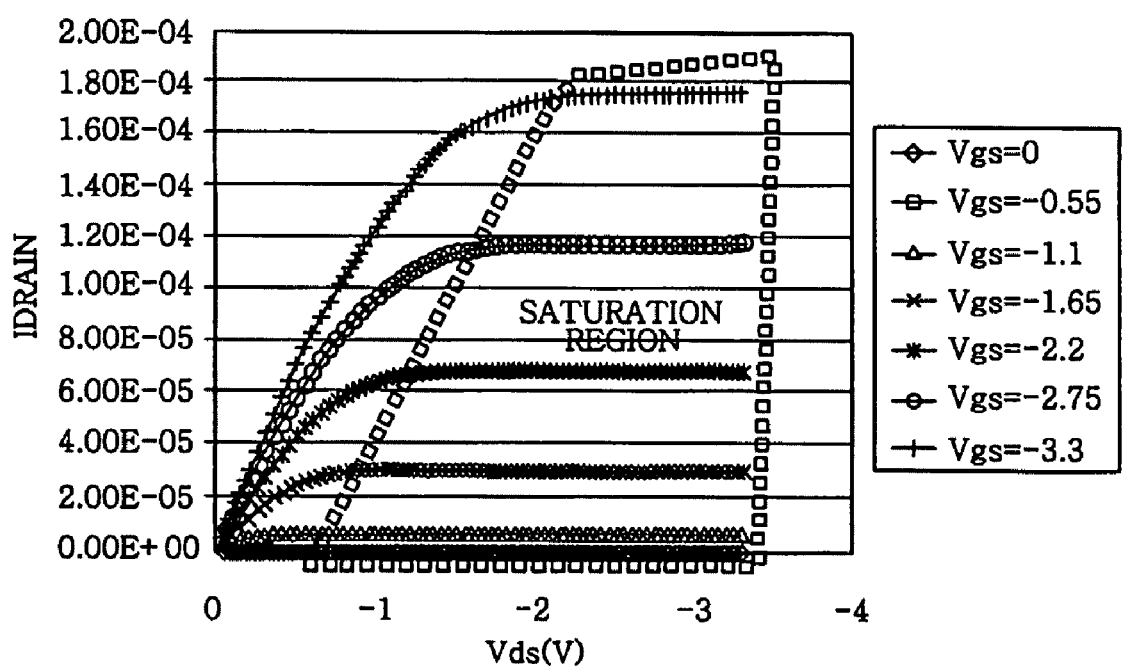
FIG. 2 shows an exemplary graph indicative of voltage and current characteristics of a metal-oxide-semiconductor field-effect transistor (MOSFET) transistor and a current saturation region of the MOSFET used under measurement conditions consistent with the present invention.

FIG. 2 shows an exemplary graph indicative of voltage and current characteristics of a MOSFET transistor and a current saturation region of the MOSFET used under measurement conditions consistent with the present invention. Measurement may be performed under a condition that the MOSFET is operated in the saturation region, namely, under the Is current condition at the saturation region.

In FIG. 2, Idrain is a drain current of the MOSFET, and Vds is the voltage between the source node and the drain node. Vgs is the voltage between the source node and the gate node.

As shown in FIG. 2, although the voltage Vds between the source and drain nodes increases when the leakage current Is is uniform (i.e., constant or unchanged), the voltage between the gate and source nodes is uniform in the saturation region.

Accordingly, when the voltage Vs of the source node increases, the voltage Vfg of the floating gate node also increases to maintain the same current. These characteristics are called source-follower characteristics.

The inverse voltage Vd applied to the diode D1 causes the leakage current Id of the diode D1. The flow of the current can be expressed by the equation shown below:

$$\int_0^t (Id)dt = Cr \times Vfg(t) + Cdgo \times (Vfg(t) - Vdrain) + \quad (1)$$
$$Csgo(Vfg(t) - Vs(t)) + Cbgo \times (Vfg(t) - Vs(t))$$

wherein Vfg(t) is a voltage of the floating gate node, Cdgo is an overlap capacitance of the gate and drain nodes, Csgo is an overlap capacitance of the floating and source nodes, and Cbgo is an overlap capacitance of the floating gate node and bulk. Because the drain node is coupled to ground, Vdrain is 0V.

In case of the MOSFET having a p channel of N-well, the floating gate voltage Vfg is lower than the source voltage Vs, so holes are injected into the floating gate node, and electrons are discharged from the floating gate node, i.e., different conductive types of impurity ions are injected into the two ends of the P-N junction. Thus, as time lapses, the floating gate voltage Vfg further increases.

Accordingly, the source voltage Vs also increases to maintain the uniform current. Thus, the voltage applied to the diode D1 is uniform while the voltage between the drain and source nodes increases by the leakage current Id of the diode D1 due to the amount of introduced electric charges.

When time 't' in equation (1) is differentiated, equation (2) shown below is obtained.

$$Id = Cr \frac{dVs(t)}{dt} + Cdgo \frac{dVs(t)}{dt} \quad (2)$$

In equation (1), as explained, Vfg(t)−Vs(t)=constant, according to the source-follower characteristics, so Vfg(t) =Vs(t)+constant, and thus, when differentiation is performed, equation (2) is obtained.

In equation (2), because Cr and Cdgo are already known values, the leakage current Id at the diode D1 can be determined by applying a DC current to a source terminal and measuring a slope of the source voltage Vs in a time domain.

The increase in the current Is applied to the source node increases Vfg−Vs, i.e., the voltage applied to the diode D1, so the leakage current Id according to the voltage can be measured according to equation (2).

Figure 3:
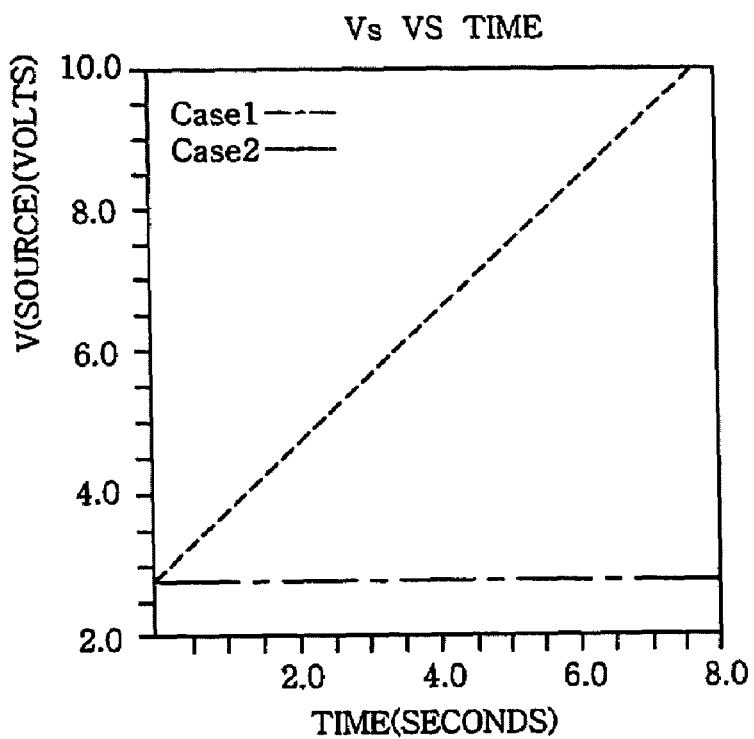
FIG. 3 shows an exemplary graph indicative of a slope of voltages over time when a leakage current of a diode changes.

FIG. 3 is a graph showing a slope of Vs over time when a leakage current of a diode changes. As shown in FIG. 3, because the voltage applied to the diode D1 is uniform, the leakage current Id is also uniform, making a linear slope.

Table 1 shows a comparison between the leakage current Id of the diode D1 calculated according to device simulation and results calculated based on equation (2).

TABLE 1

| Cases | Cr (fF) | Cdgo (fF) | dVs/dt | Id by simulation | Extracted ID |
|---|---|---|---|---|---|
| Case 1 | 1.922 | 0.339 | 0.04695 | $1.0623 * 10^{-16}$ | $1.061539 * 10^{-16}$ |
| Case 2 | 1.922 | 0.339 | 0.738 | $1.671 * 10^{-15}$ | $1.668618 * 10^{-15}$ |

As shown in Table 1, an error between the leakage current Id of the diode D1 according to the measured results of the simulation and the leakage current Id calculated based on equation (2) is less than 1%. Although the leakage current levels are in the range of $10^{-16}$-$10^{-15}$, such leakage current can be easily measured by existing measurement equipment based on equation (2), because the voltage levels to be measured in the calculation of equation (2) may be easily measured by existing measurement equipment. Thus, an array structure of diode D1 may be unnecessary.

Figure 4:
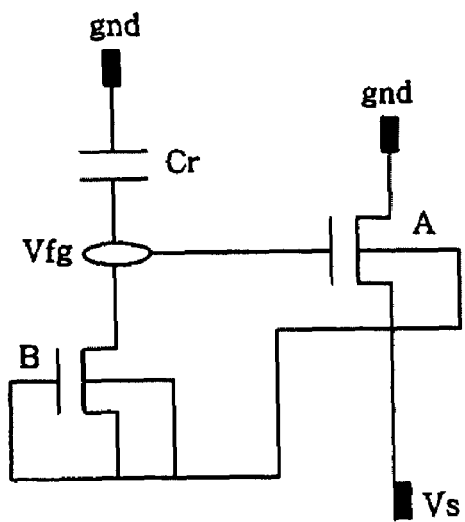
FIG. 4 shows an exemplary circuit diagram of an apparatus for measuring a leakage current consistent with the present invention.

FIG. 4 shows an exemplary circuit for measuring a leakage current consistent with the present invention. The circuit may be used to measure a leakage current of the P-N junction region included in a MOSFET transistor. More specifically, the circuit may be used to measure the leakage current of the drain of the MOSFET transistor when the MOSFET transistor is in an OFF state.

As shown in FIG. 4, the circuit may include a MOSFET transistor A, a MOSFET transistor B, and a capacitor Cr. The circuit may also include electrical terminals or connection points for ground and various voltages. A P-N junction region of the drain of the MOSFET transistor B region may incur a leakage current to be measured.

The drain node of the MOSFET transistor B may be commonly coupled with the reference capacitor Cr and a floating gate node of the MOSFET transistor A. A gate node, a source node, and a bulk node of the MOSFET transistor B are coupled with a source node of the MOSFET transistor A.

The MOSFET transistor A may be operated as a source-follower MOSFET transistor as explained previously. In order to remove a voltage difference between the floating gate node and the bulk well of MOSFET transistor A, the source node of MOSFET transistor A is commonly coupled with the bulk node of MOSFET transistor A. And, the drain node of MOSFET transistor A is coupled to ground. One node of the reference capacitor Cr is also coupled to ground.

Under such a configuration, the MOSFET transistor B may be equivalent to a semiconductor device with two ends, one end corresponding to the drain node, and the other end corresponding to the coupled gate node, source node, and bulk node. In such a structure, the leakage current of the drain node of the MOSFET transistor B may be calculated through equation (2) as described above with reference to FIGS. 1 to 3.

As described above, the method and apparatus for measuring a leakage current in accordance with the present invention may have the following advantages.

First, the leakage current of the P-N junction of the semiconductor device can be accurately measured.

Second, the area required by a testing device for measuring the leakage current can be reduced.

Third, the precision in measuring the leakage current (which can be very small) can be maximized by accumulating over a period of time.

Fourth, the leakage current of the source or the drain of the MOSFET transistor can be measured.

It is understood by those skilled in the art that various changes and modifications may be made without departing from the spirit and scope of the invention as defined in the following claims.

What is claimed is:

1. An apparatus for measuring a leakage current of a semiconductor device having a first end and a second end, comprising:
a capacitor having one end coupled with the first end of the semiconductor device; and
a MOSFET transistor having a drain node, a gate node, a source node, and a bulk node, wherein the gate node is configured to be coupled with the first end of the semiconductor device; and the source node and the bulk node are configured to be coupled with the second end of the semiconductor device and to receive power.

2. The apparatus of claim 1, wherein the second end of the capacitor is coupled to ground.

3. The apparatus of claim 1, wherein the drain node is coupled to ground.

4. The apparatus of claim 1, wherein the semiconductor device is a diode.

5. The apparatus of claim 1, wherein the semiconductor device is a test MOSFET transistor having a drain node coupled with the gate node of the MOSFET transistor and the capacitor, and a gate node, a source node, and a bulk well of the MOSFET transistor coupled with the source node of the MOSFET transistor.

6. A method used in an apparatus for measuring a leakage current of a semiconductor device having a first end and second end, the apparatus including a capacitor having one end coupled with the first end of the semiconductor device and a MOSFET transistor having a drain node, a gate node, a source node, and a bulk node, wherein the gate node is configured to be coupled with the first end of the semiconductor device, and the source node and the bulk node are configured to be coupled with the second end of the semiconductor device and to receive power, comprising:
applying current to the source node;
measuring voltage of the source node versus time; and
measuring a leakage current of the semiconductor device based on the voltage of the source node versus time.

7. The method of claim 6, wherein the leakage current of the semiconductor is determined by applying the voltage of the source node versus time to an equation of $$Id = Cr\frac{dVs(t)}{dt} + Cdgo\frac{dVs(t)}{dt},$$

wherein Id is the leakage current of the semiconductor device, Cr is capacitance of the capacitor, Vs(t) is voltage of the source node versus time, and Cdgo is an overlap capacitance of the drain and the gate.

8. The method of claim 6, wherein another end of the capacitor is coupled to ground.

9. The method of claim 6, wherein the drain node is coupled to ground.

10. The method of claim 6, wherein the semiconductor device is a diode having one end coupled with the capacitor and the gate node and the other end coupled with the source node.

11. The method of claim 6, wherein the semiconductor device is a test MOSFET transistor having a drain node coupled with the floating gate node of the MOSFET transistor and the capacitor, and a gate node, a source node, and a bulk well coupled with the source node of the MOSFET transistor.

* * * * *